(12) United States Patent
Cudak et al.

(10) Patent No.: US 9,083,170 B2
(45) Date of Patent: Jul. 14, 2015

(54) CABLE TRACING IN A DATACENTER

(71) Applicant: International Business Machines Corporation, Armonk, NY (US)

(72) Inventors: Gary D. Cudak, Creedmoor, NC (US); Christopher J. Hardee, Raleigh, NC (US); Adam Roberts, Moncure, NC (US); Edward S. Suffern, Chapel Hill, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 158 days.

(21) Appl. No.: 13/887,454

(22) Filed: May 6, 2013

(65) Prior Publication Data

US 2014/0327539 A1 Nov. 6, 2014

Related U.S. Application Data

(63) Continuation of application No. 13/886,296, filed on May 3, 2013.

(51) Int. Cl.
*G08B 1/08* (2006.01)
*G01R 31/08* (2006.01)
(Continued)

(52) U.S. Cl.
CPC ............... *H02G 3/385* (2013.01); *G01R 31/02* (2013.01); *G01R 31/041* (2013.01); *H02G 1/00* (2013.01); *G01R 27/16* (2013.01); *G01R 31/026* (2013.01)

(58) Field of Classification Search
CPC ......... H02G 1/00; H02G 3/385; G01R 27/16; G01R 31/02; G01R 31/026; G01R 31/041; G01R 31/086; G01R 31/021; G01R 31/024; G01R 19/16528; G01V 3/081; G01V 3/104; G06F 11/24; H04L 12/2697; H04L 43/50; G01S 2007/406; G08B 29/04
USPC .............. 340/584, 581, 539.1, 651, 657, 596; 324/522, 713, 67, 533, 539, 543, 537, 324/233, 335, 508, 609, 66, 232; 702/85, 702/59, 58; 336/175
See application file for complete search history.

(56) References Cited

U.S. PATENT DOCUMENTS 5,152,698 A 10/1992 Juhlin et al.
6,148,419 A 11/2000 Ahrens et al.
(Continued)

FOREIGN PATENT DOCUMENTS

CN 201955417 U 8/2011
JP 10282175 A 10/1998
(Continued)

OTHER PUBLICATIONS

Wang, et al., "CN201955417U Aug. 31, 2011 Rapid line inspector with LEDs (light-emitting diodes)" English abstract, Baoding Tianwei Group Co., Ltd, Dec. 16, 2010, 8 pages.
(Continued)

*Primary Examiner* — Mirza Alam
(74) *Attorney, Agent, or Firm* — Katherine S. Brown; Jeffrey L. Streets (57) ABSTRACT

Embodiments of the invention provide a method of tracing cable through a datacenter. The method causes a cable to emit a radio frequency signal along the length of the cable. One or more structural members have a detection circuit that will illuminate in response to detecting the radio frequency signal with greater than a threshold signal strength, such that the one or more structural members are easy to identify when the detection circuit is illuminated. The one or more structural members may be removed to gain physical access to the cable.

6 Claims, 6 Drawing Sheets

(51) Int. Cl.
*G01R 31/00* (2006.01)
*G01R 31/02* (2006.01)
*G06F 11/30* (2006.01)
*H02G 3/38* (2006.01)
*G01R 31/04* (2006.01)
*H02G 1/00* (2006.01)
*G01R 27/16* (2006.01)

(56) References Cited

U.S. PATENT DOCUMENTS

| | | |
|---|---|---|
| 6,346,977 B1 | 2/2002 | Westerman |
| 6,532,328 B1 | 3/2003 | Kline |
| 6,708,830 B2 | 3/2004 | Mendoza |
| 6,732,478 B1 | 5/2004 | Russell et al. |
| 7,285,958 B2 | 10/2007 | Overby et al. |
| 7,884,615 B1* | 2/2011 | Lo et al. ............... 324/533 |
| 8,102,169 B2 | 1/2012 | Law et al. |
| 2004/0222008 A1 | 11/2004 | Hyde |
| 2006/0158172 A1* | 7/2006 | King ....................... 324/66 |
| 2006/0267590 A1* | 11/2006 | Mizuno ................... 324/329 |
| 2007/0001709 A1 | 1/2007 | Shen |
| 2008/0204034 A1* | 8/2008 | Blades .................... 324/522 |
| 2009/0128161 A1* | 5/2009 | Xu et al. ................. 324/539 |
| 2009/0224747 A1 | 9/2009 | Heger et al. |
| 2009/0309611 A1* | 12/2009 | Butler et al. ............ 324/537 |
| 2011/0034068 A1 | 2/2011 | Russell |
| 2012/0086428 A1 | 4/2012 | Bradley, II |

FOREIGN PATENT DOCUMENTS

| | | |
|---|---|---|
| JP | 10171376 A | 8/2010 |
| WO | WO2011013264 A1 | 2/2011 |

OTHER PUBLICATIONS

Katabushi, et al., "JP10282175A Oct. 23, 1998 Wiring Path Searching Apparatus" English abstract, Togami Electric Mfg Co Ltd, Mar. 31, 1997, 9 pages.

Kamimura, et al., "JP2010171376A Aug. 5, 2010 Group III Nitride-Based Compound Semiconductor Light-Emitting Device" English abstract, Toyoda Gosei Co Ltd, Sep. 29, 2009, 40 pages.

Narendran, et al., "Characterizing White LEDs for General Illumination Applications", Lighting Research Center, Presented at SPIE's Phontonics West Conference, Jan. 23-28, 2000, San Jose, CA, SPIE Paper # 3938-39, 10 pages.

Ogrodnik, "Use of color-changing pigment to detect wire and cable hazards", Technical Paper, Wire Journal International, Apr. 2008, pp. 150-155.

* cited by examiner

CABLE TRACING IN A DATACENTER

CROSS-REFERENCE TO RELATED APPLICATIONS

This application is a continuation of U.S. patent application Ser. No. 13/886,296 filed on May 3, 2013.

BACKGROUND

1. Field of the Invention

The present invention relates to systems and methods for identifying and locating an electronically conducting cable in a datacenter.

2. Background of the Related Art

Modern datacenters contain a large number of computers, switches and other information technology equipment that are interconnected by a large number of cables. In order to organize these cables, rack system have cable channels and the datacenter has overhead cable trays and an elevated floor to allow cables to be run under the floor. This configuration is beneficial for keeping the cables out of the way and allowing a user to gain access to the computers, switches and other information technology equipment.

During installation of new equipment, reconfiguration of a system, or maintenance of the system, there may be a need to determine the path of a particular cable. For example, a user may want to know where a second end a given cable is connected. Furthermore, even if the user knows where both ends of a given cable are connected, the user may not know the path that the cable takes. In order to remove a cable, it may be necessary to physically access the path of the cable to get the cable free from a bundle. In another example, a cable can become caught when running or pulling a cable through a cable tray, channel or other pathway. However, the cables may be hidden from view, either by rack panels, floor tiles and cable tray members, or by the large number of cables. It can consume a significant amount of time tracing a cable through a large and complex datacenter by removing floor tiles and rack panels through trial and error until the cable pathway or other useful information has been determined.

BRIEF SUMMARY

An embodiment of the present invention provides a method of tracing cable through a datacenter. The method comprises causing a cable to emit a radio frequency signal along the length of the cable, identifying one or more structural members having a detection circuit that has illuminated in response to detecting the radio frequency signal with greater than a threshold signal strength, and removing the one or more structural members to gain physical access to the cable.

DETAILED DESCRIPTION

One embodiment of the present invention provides a cable detection system. The cable detection system comprises a radio frequency signal generator and driver circuit having its output in communication with a transformer, wherein the transformer has a first output coupled to a cable shield of an elongate cable and a second output coupled to a dedicated transmission wire extending lengthwise with the cable and exterior to the cable shield. The cable detection system further comprises a plurality of detection circuits, wherein each detection circuit includes an electromagnetically-powered receiver coupled to a light emitting diode, and wherein radio frequency signals emitted from the transmission wire activate the light emitting diodes of the detection circuits within a detection distance of the cable.

The signal generator and driver circuit are embedded in the cable driving port, which has a unique identification. One embodiment uses the Media Access Control (MAC) address to uniquely identify the port with its connected cable. The data center management entity has knowledge of the MAC address and correlates that MAC address to a specific server or ITE. That specific server or ITE contains a baseboard management controller. The data center management entity then sends an Ethernet command to the BMC to activate the signal generator (see oscillator 22 shown in FIG. 1). Activation of the signal generator sends out a radio-frequency signal along the length of the cable (see cable portion 11 in FIG. 1). This RF signal then activates the detection circuits (see FIG. 5). The illumination of the LEDs in the detection circuits then indicate the cable path. Another method for activating the signal generator and driver circuit may include adding a cable identification button on the front of the server. This cable identification button may be connected to the BMC. For example, activating (pushing) the button one time may activate the cable identification circuitry for port 1, activating (pushing) the button twice activate port 2, and so on.

In various embodiments of the invention, the signal generator and driver circuit may be included in different components. Optionally, the signal generator and driver circuit may be included in a device to which the cable is selectively connected. Such a device might be referred to as a paddle card or network adapter. This option has the advantage of simplifying the cable and using power from the device. In another option, the signal generator and driver circuit may be secured to the cable and electronically connected to a battery for selectively powering the signal generator and driver circuit. This option has the advantage that the system can be implemented without modification of any devices other than the cables. In a further option, the system may further comprise a handheld device including a power source for selectively powering the signal generator and driver circuit to cause the transmission wire to emit the radio frequency signals. Embodiments with a handheld device will preferably include the signal generator and driver circuit as part of the handheld device. Use of a handheld device has the advantage of avoiding the cost of having a signal generator and driver circuit for each cable or device.

In another embodiment of the cable detection system, the light emitting diodes are activated by a predetermined frequency. More particularly, the receiver is designed to receive power from an electromagnetic signal having a predetermined frequency, and the receiver provides that power to the light emitting diodes for generating light. In one option, the light emitting diodes are activated by a plurality of frequencies, wherein each of the plurality of frequencies cause the light emitting diode to generate a different color of light. In another option, the plurality of detection circuits includes a first plurality of detection circuits responsive to a first frequency and a second plurality of detection circuits responsive to a second frequency. Accordingly, the first plurality of detection circuits may have light emitting diodes that generate a first color of light and the second plurality of detection circuits may have light emitting diodes that generate a second color of light. Embodiments using more than one color of light may facilitate the simultaneous tracing of more than one cable or more than one type of cable.

In accordance with embodiments of the invention, the plurality of detection circuits are spaced-apart in a datacenter. For example, the plurality of detection circuits may be disposed on, or embedded in, the outwardly facing surface of floor tiles in a datacenter, outwardly facing surfaces of a cable tray, and outwardly facing surfaces of a computer rack. Accordingly, when the transmission wire associated with a particular cable is caused to emit a radio-frequency signal, electrical energy is induced in the detection circuits that are tuned to that frequency and are located within a detection distance of the particular cable. These detection circuits then activate the attached light emitting diodes to emit visible light. A series of lighted diodes identify the path of the particular cable. A user may then go directly to the rack panels, floor tiles or cable tray members where the cable is located.

Still further embodiments of the invention provides a method of tracing cable through a datacenter. The method comprises causing a cable to emit a radio frequency signal along the length of the cable, identifying one or more structural members having a detection circuit that has illuminated in response to detecting the radio frequency signal with greater than a threshold signal strength, and removing the one or more structural members to gain physical access to the cable.

Optionally, the method may further include pulling the cable under removable panels of an elevated floor. In response to a lead end of the cable getting stuck under the elevated floor, a user may identify, from among the one or more structural members having a detection circuit that has illuminated, a target structural member at the end of a path of detection circuits that have illuminated. The target structural member may be removed to gain physical access to a lead end of the cable. Used in this manner, the method avoids wasting time in a trial and error approach to locating the point where the cable has become stuck.

Figure 1:
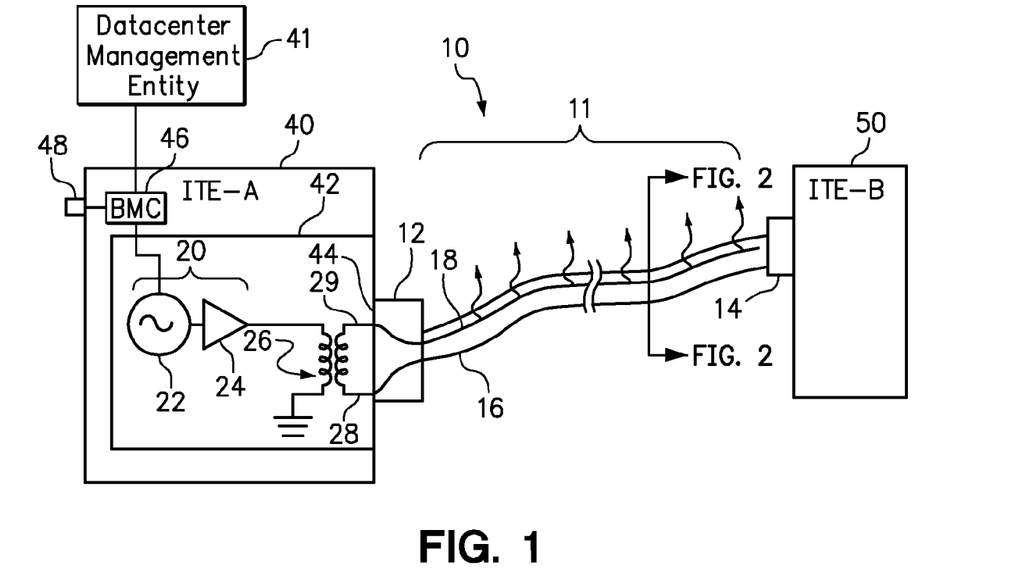
FIG. 1 is a diagram of a cable connected between two devices and emitting a radio frequency signal in accordance with the present invention.

FIG. 1 is a diagram of a cable connected between two devices and emitting a radio frequency signal in accordance with the present invention. For example, the cable 10 may be a computer network cable, such as an Ethernet, Fire wire or Fiberchannel cable, Infiniband and the two devices 40, 50 may be compute nodes, network switches, data storage devices, or combinations thereof. In the embodiment shown, ITE-A 40 (information technology equipment) includes a paddle card 42 with a connector 44 for selectively coupling with a connector 12 on one end of the cable 10. The paddle card 42 receives electrical power from the ITE-A 40 for operating a signal generator and driver circuit 20, which includes a signal generator 22 and an driver or amplifier 24. The output of the signal generator and driver circuit 20 is provided to a transformer 26, which has a first output 28 that is coupled to shielding 16 that surrounds the signal wires (not shown) of the network cable 10 and a second output 29 that is coupled to a dedicated transmission wire 18 that extends lengthwise along a central portion 11 of the cable 10 outside of the shielding 16. When the signal generator and driver circuit 20 is activated, the dedicated transmission wire 18 emits an electromagnetic signal at a frequency and power determined by the signal generator and driver circuit 20. The electromagnetic signal may be pulsed or static. None of the components shown in FIG. 1 interfere with the signal wires and normal functioning of the network cable 10, including the connector 14 on a second end of the cable 10. The second connector 14 couples the second end of the cable 10 to a second device, shown as ITE-B 50.

As shown, the signal generator (oscillator) 22 is activated by a baseboard management controller (BMC) 46 of the ITE-A 40. The BMC 46 may activate the signal generator 22 in response to detecting that a button 48 has been pushed and/or may activate the signal generator 22 in response to receiving an Ethernet command from a datacenter management entity 41.

Figure 2:
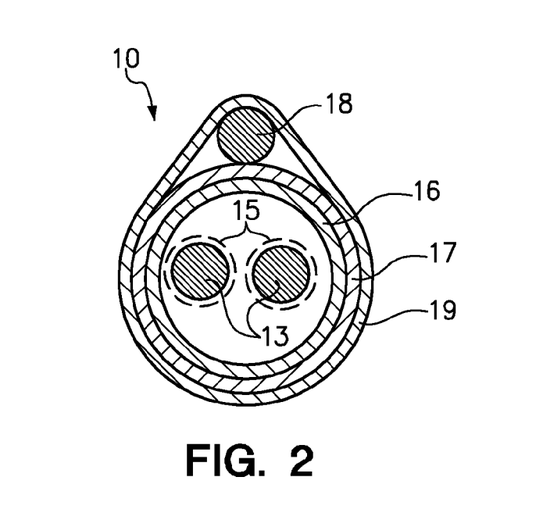
FIG. 2 is a cross-sectional diagram of the cable.

FIG. 2 is a cross-sectional diagram of one embodiment of the central portion 11 the cable 10. Beginning in the middle, the cable 10 includes a pair of network communication wires 13, but additional pairs may be included. For example, an Ethernet cable would include four pairs of wires. Each of the wires 13 will have its own electrically insulating coating 15. An electrically-conductive shield 16 surrounds the wires 13 to prevent or reduce electromagnetic interference, and an electrically-insulating coating 17 covers the shield 16. The coating 17 and everything inside of the coating 17 makes a conventional communication cable 10. However, the cable 10 of the present invention adds a transmission wire 18 outside of the shield 16 and insulative coating 17. The transmission wire 18 is secured to the cable by a further coating, shield or tape 19. Referring to both FIG. 1 and FIG. 2, the first output 28 of the transformer 26 is coupled to the shield 16 and the second output 29 of the transformer 26 is coupled to the transmission wire 18.

Figure 3:
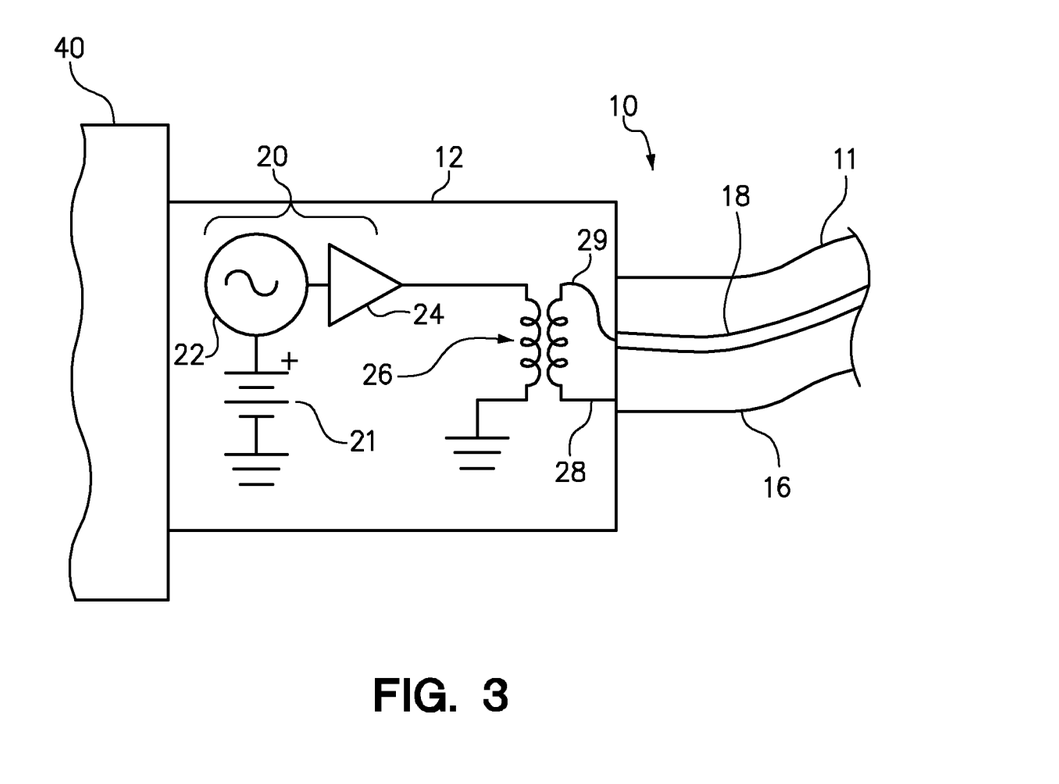
FIG. 3 is a diagram of a battery powered embodiment of the cable.

FIG. 3 is a diagram of a battery powered embodiment of the cable 10. The first connector 12 is coupled to ITE-A 40 for the purpose of network communications. Note that this may be necessary if the ITE has no operational power, only stand-by power in which the BMC is powered and nothing else. However, the connector 12 includes the signal generator and driver circuit 20 and the inductor 26, which function as discussed in relation to FIG. 1. Furthermore, the connector 12 includes a battery 21 that supplies power to the circuit 20. The central portion 11 of the cable 10 is the same as in FIG. 1, including the shield 16 coupled to the first output 28 of the transformer 26 and the transmission wire 18 coupled to the second output 29 of the transformer 26.

Figure 4:
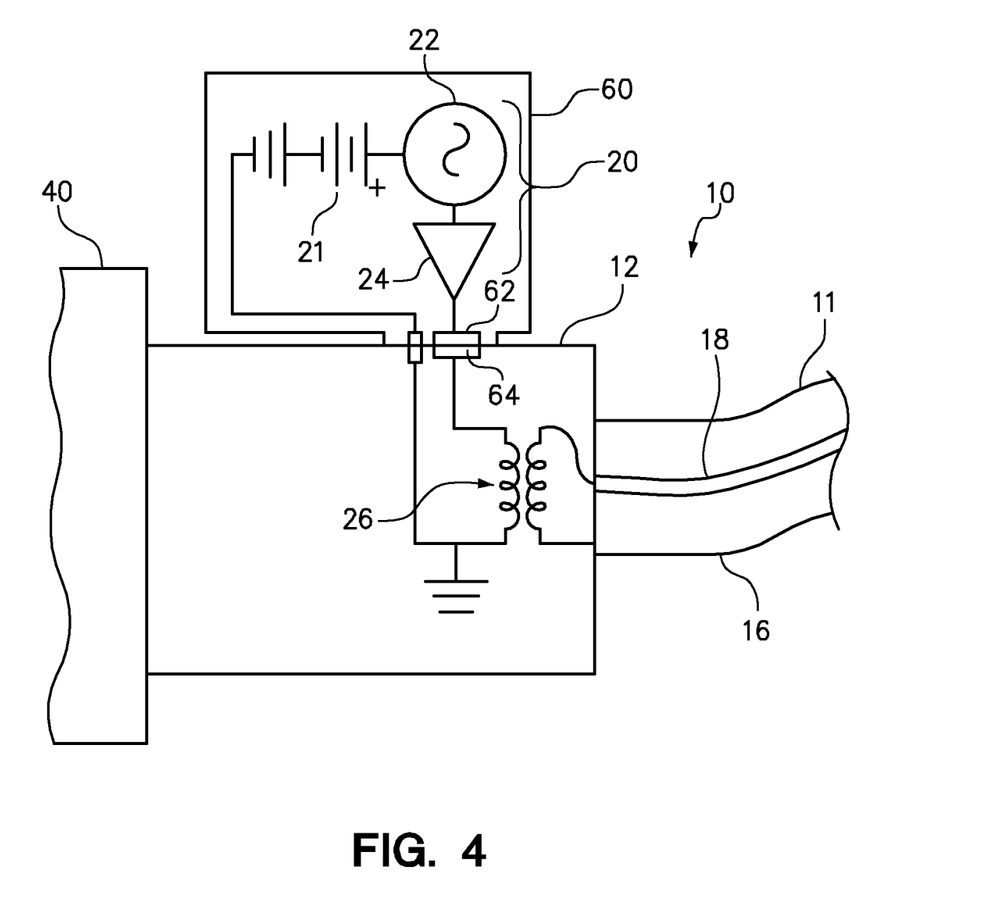
FIG. 4 is a diagram of a handheld device for activating a transmission line of a cable.

FIG. 4 is a diagram of a handheld device 60 for activating a transmission line of a cable 10. In this embodiment, the handheld device 60 includes the battery 21 and the signal generator and driver circuit 20. The output of the driver 24 terminates at an external contact 62, which can be placed in contact with an external contact 64 on the network cable connector 12. As seen by a comparison of FIG. 4 with FIG. 3, the handheld device 60 completes the circuit so that it operates the same as the circuit in FIG. 3. However, the network cable connector 12 is simplified, since it only includes the transformer 26. Other ways of distributing the circuit among the connector 12 and the handheld device 60 may be similarly implemented. The network cable signal wires (not shown; see FIG. 2) are still used in a conventional manner to communicate with device 40.

Figure 5:
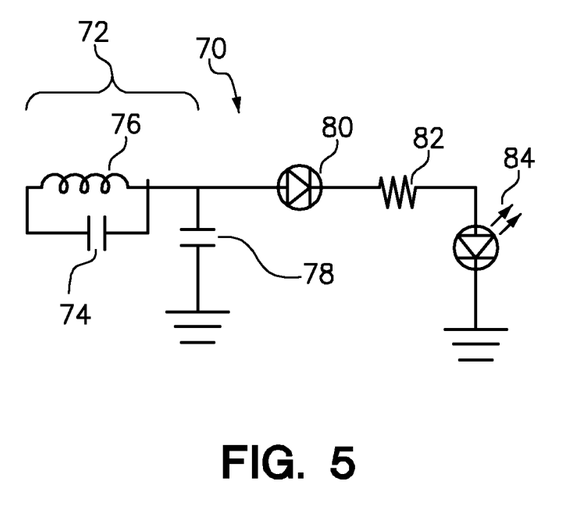
FIG. 5 is a diagram of a detection circuit.

FIG. 5 is a diagram of a detection circuit 70. The detection circuit 70 includes a receiver 72 with a capacitor 74 and inductor 76 in parallel. The detection circuit 70 further includes a capacitor 78, a diode 80, a series resistor 82, and a light emitting diode 84. When the receiver 72 receives an electromagnetic signal of a particular frequency (or frequency range as determined by components 74 and 76), the light emitting diode 84 is activated, such that the light emitting diode 84 generates light. For example, the detection circuit 70 may be tuned to respond a 1 MHz frequency emitted by the cable 10 (FIGS. 1-4). A detection circuit may be tuned to respond to a different frequency and provide one or more output colors or activate alternate LEDs to distinguish between multiple cables. Furthermore, the series value of the resistor 82 can be selected to reduce or extend the range of detection circuits that will illuminate.

The detection circuit 70 may include more than one receiver 72 in order to detect and activate the LED in response to more than one frequency of electromagnetic signal. A multi-color LED may emit a different color depending on the frequency detected. However, the frequency detection circuitry would need to be added for each additional color.

Figure 6:
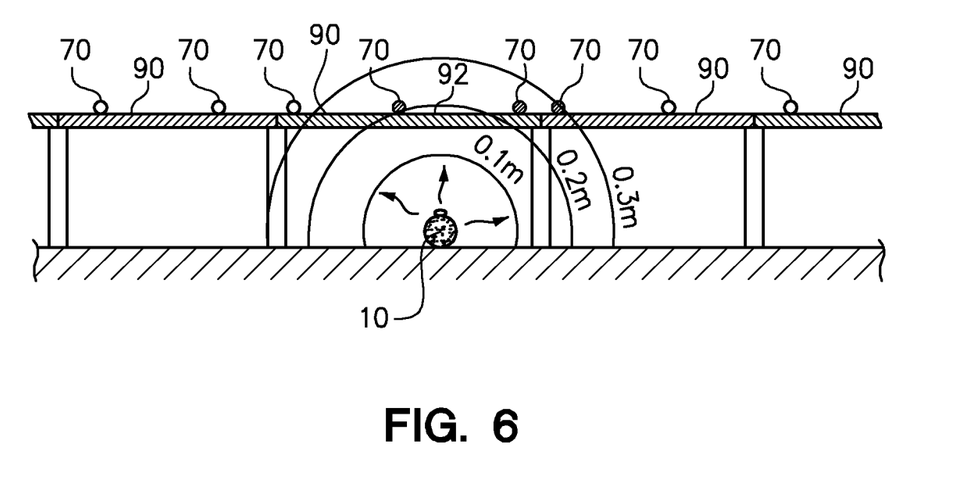
FIG. 6 is a diagram of a cable emitting a signal from beneath floor tiles in a data center.

FIG. 6 is a diagram of a cable 10 emitting a signal (illustrated as wavy arrows) from beneath elevated floor tiles 90 in a data center. The signal has a particular frequency, as described above, and a power that drops off with distance from the cable 10 (source of the signal). Specifically, the power drop-off versus distance that a radio-frequency transmission signal travels is related to the square of the distance from the source as well as the square of the wavelength of the signal. The relationship between power and distance is described by Friis' transmission formula. The diagram shows three distance curves, for example at 0.1 meters, 0.2 meters, and 0.3 meters distance from the cable 10, respectively.

A plurality of detection circuits 70 are disposed on, or embedded within, the floor tiles 90 over the area of the datacenter where cable may be run. Those detection circuits 70 that are diposed within a given distance of the cable 10 will, while the cable is emitting a signal, receive enough power to activate the LED. For example, the three detection circuits 70 that are within 0.3 meters of the cable 10 may be illuminated, while all other detection cricuits 70 are not illuminated. Accordingly, a user can see the illuminated LEDs and know that the cable 10 is below that area of the elevated floor tiles 90, such as below floor tile 92.

Figure 7:
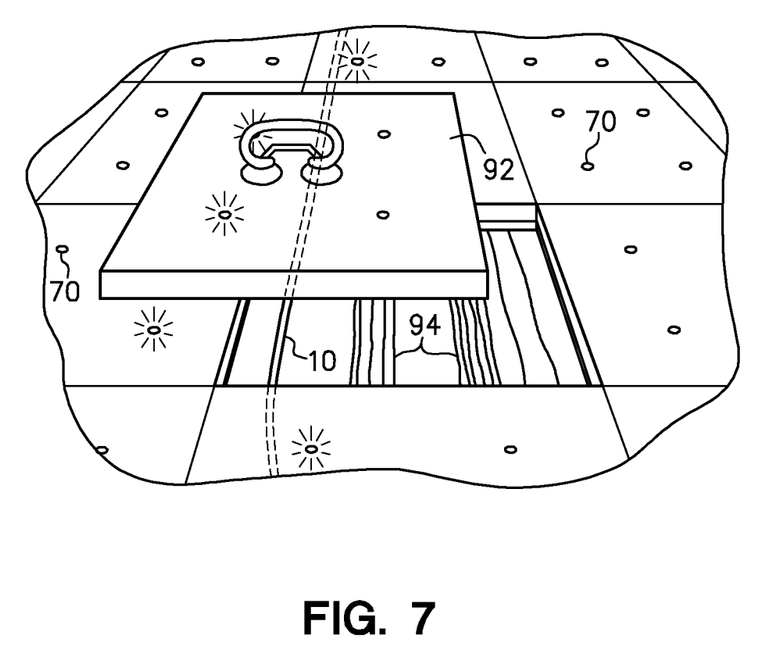
FIG. 7 is a perspective view of the floor tiles in a datacenter with one of the floor tiles removed to locate a particular cable.

FIG. 7 is a perspective view of the floor tiles 90 in a datacenter with the floor tile 92 removed to locate the particular cable 10. Note that the LEDs closest to the cable 10 are illuminated to indicate that which floor tile 92 should be removed. It should be appreciated that the particular cable 10 may be located in this manner, despite the proximity to a bundle of cables 94.

Figure 8:
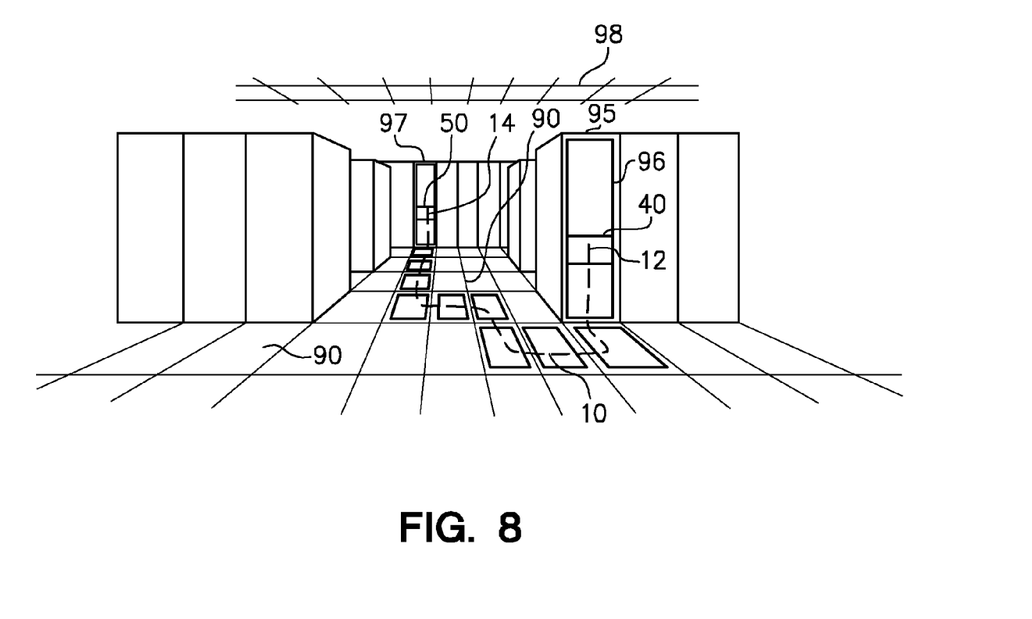
FIG. 8 is a perspective view of a datacenter having a cable extending between two devices and causing the light emitting diodes of various detection circuits to light up along the path of the cable.

FIG. 8 is a perspective view of a datacenter having a cable 10 (shown with a dashed line) extending between a first end 12 coupled to a first device 40 and a second end coupled to a second device 50. When the cable 10 emits a signal, detection circuits spaced apart on the rack panels 96, the floor tiles 90, and/or the cable tray members 98 activate their light emitting diodes to light up along the path of the cable 10. In FIG. 8, the illuminated path would indicate that the cable 10 passes from a first rack 95 and under a number of floor tiles (illustrated with outlining) to a second rack 97. The user can easily determine with rack panels and floor tiles to remove to gain access to the cable 10.

It should be appreciated that if a cable that is being pulled or run under the floor tiles has gotten caught, illumination of the detector circuits will reveal the path of the cable 10, except that the path will terminate at the point that the cable is caught. Accordingly, the user can go directly to the floor tile where the end cable is located in order to free the cable.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   causing a cable to emit a radio frequency signal along a length of the cable by supplying power to a radio frequency signal generator and driver circuit having its output in communication with a transformer, wherein the transformer has a first output coupled to a cable shield of the cable and a second output coupled to a dedicated transmission wire extending lengthwise with the cable and exterior to the cable shield;
   identifying one or more structural members having a detection circuit that has illuminated in response to detecting the radio frequency signal with greater than a threshold signal strength; and
   removing the one or more structural members to gain physical access to the cable.

2. The method of claim 1, further comprising:
   selectively positioning a handheld device in contact with a cable connector at one end of the cable in order to supply power to the radio frequency signal generator and driver circuit.

3. The method of claim 1, further comprising:
   coupling a first cable connector at a first end of the cable to a port of a first unit of information technology equipment, wherein the port supplies power to the radio frequency signal generator and driver circuit.

4. The method of claim 1, further comprising:
   securing one or more detection circuits to the structural members in a datacenter, wherein each detection circuit includes an electromagnetically-powered receiver coupled to a light emitting diode, and wherein the radio frequency signal emitted from the transmission wire activates the light emitting diode of each of the detection circuits within a detection distance of the cable.

5. The method of claim 1, further comprising:
   pulling the cable under removable panels of an elevated floor; in response to a lead end of the cable getting stuck under the elevated floor, identifying, from among the one or more structural members having detection circuits that have illuminated, a target structural member at an end of a path of the detection circuits that have illuminated; and removing the target structural member to gain physical access to a lead end of the cable.

6. The method of claim 1, further comprising:
   each detection circuit generating a first color of light in response to detecting a first radio frequency signal and generating a second color of light in response to detecting a second radio frequency signal.

* * * * *